US008253905B2

(12) United States Patent
Lu et al.

(10) Patent No.: US 8,253,905 B2
(45) Date of Patent: Aug. 28, 2012

(54) LIQUID CRYSTAL DISPLAY DEVICE AND METHOD OF MAKING THE SAME

(75) Inventors: Yung-Hsin Lu, Taoyuan County (TW); Yu-Ting Chen, Taoyuan County (TW)

(73) Assignee: HannStar Display Corp., Wugu Industrial Zone, Taipei County (TW)

( * ) Notice: Subject to any disclaimer, the term of this patent is extended or adjusted under 35 U.S.C. 154(b) by 726 days.

(21) Appl. No.: 12/170,452

(22) Filed: Jul. 10, 2008

(65) Prior Publication Data

US 2009/0147168 A1 Jun. 11, 2009

(30) Foreign Application Priority Data

Dec. 5, 2007 (TW) .............................. 96146321 A

(51) Int. Cl.
*G02F 1/1343* (2006.01)
(52) U.S. Cl. ........... 349/139; 349/38; 349/147; 349/187
(58) Field of Classification Search .................... 349/55, 349/139, 147, 192
See application file for complete search history.

(56) References Cited

U.S. PATENT DOCUMENTS

| 5,790,222 | A | * | 8/1998 | Kim | 349/139 |
| 6,633,359 | B1 | * | 10/2003 | Zhang et al. | 349/141 |
| 2005/0068484 | A1 | * | 3/2005 | Choo et al. | 349/144 |
| 2005/0077524 | A1 | | 4/2005 | Ahn | |

FOREIGN PATENT DOCUMENTS

| TW | 200301840 | 7/2003 |
| TW | 200729502 | 8/2007 |

* cited by examiner

*Primary Examiner* — Michael Caley
(74) *Attorney, Agent, or Firm* — Wintson Hsu; Scott Margo

(57) ABSTRACT

The present invention provides a liquid crystal display device including a substrate, a first conductive layer disposed on the substrate, a gate insulating layer covering the first conductive layer, and a second conductive layer disposed on the gate insulating layer, wherein the first conductive layer including a first sub-data line and a gate line, the second conductive layer including a source electrode and a common electrode, and the common electrode is disposed opposite to the first conductive electrode, and a method of making the same with five photolithographic and etching processes.

20 Claims, 14 Drawing Sheets

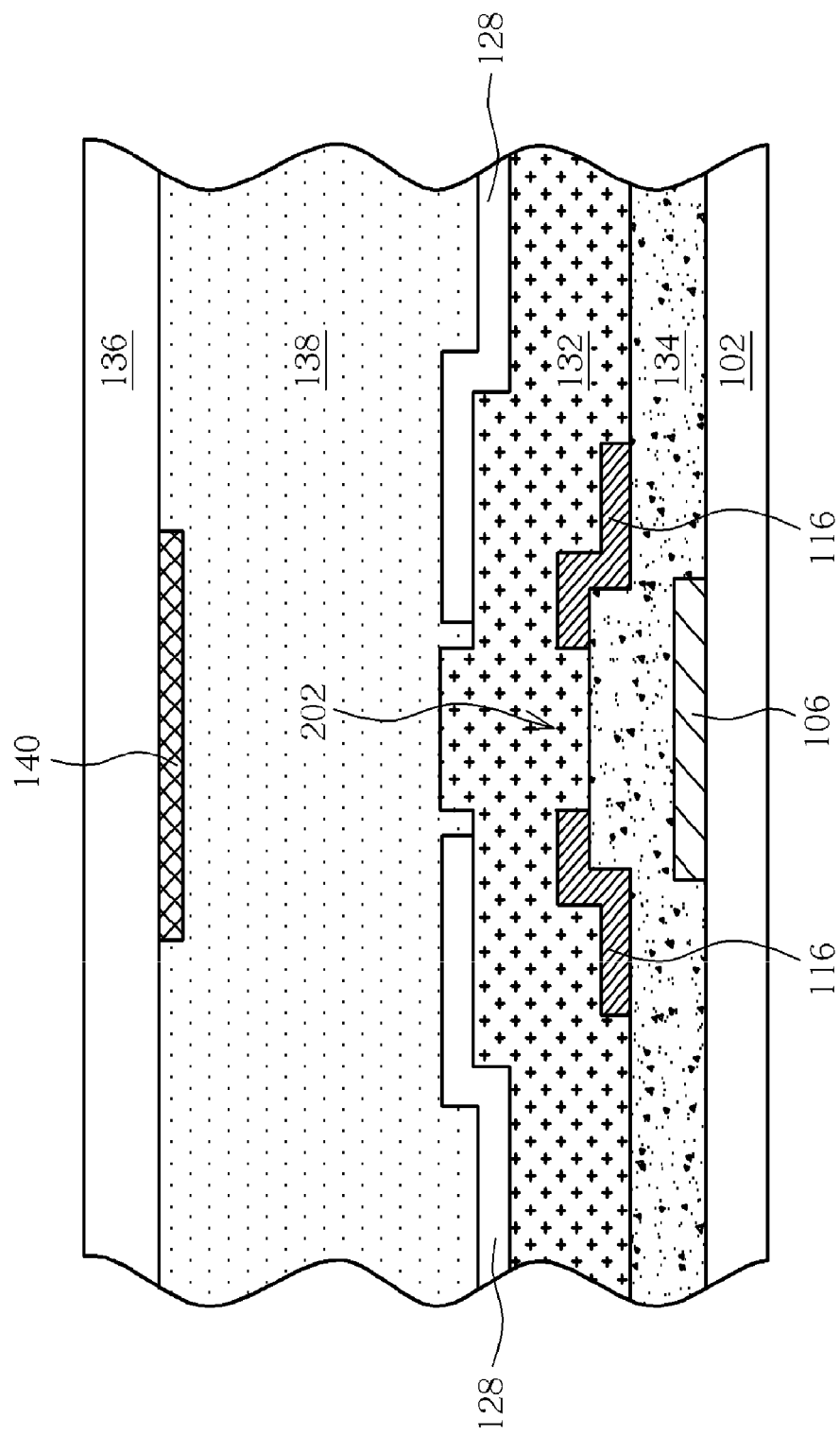

LIQUID CRYSTAL DISPLAY DEVICE AND METHOD OF MAKING THE SAME

BACKGROUND OF THE INVENTION

1. Field of the Invention

The present invention relates to a liquid crystal display device and a method of making the same, and more particularly, to a liquid crystal display device having the coupling effect improved and a method of making the same with five photolithographic and etching processes (PEPs).

2. Description of the Prior Art

Due to advantages of small size and low radiation, the liquid crystal display (LCD) has been the most popular display.

Referring to FIG. 1, FIG. 1 is a schematic diagram illustrating a top view of a pixel structure of an LCD according to a prior art. As shown in FIG. 1, two adjacent data lines 12 and two adjacent scan lines 14 define a pixel structure 10 of an LCD according to the prior art. Each pixel structure 10 comprises a thin film transistor 18 (TFT), a pixel electrode 20 and a common electrode 22. Referring to FIG. 2 together with FIG. 1, FIG. 2 is a schematic diagram illustrating a cross-section of the LCD along line AA' of FIG. 1. The line AA' is along the cross-section of the data line 12, and FIG. 2 shows the cross-section of two adjacent pixel structures 10. As shown in FIG. 2, the LCD of the prior art comprises a first substrate 24, a second substrate 32 and a liquid crystal layer 34 disposed between the first substrate 24 and the second substrate 32. A common electrode 22, a gate insulating layer 26 covering the common electrode 22 and the first substrate 24, a data line 12 disposed on the gate insulating layer 26, a passivation layer 30 covering the data line 12 and the gate insulating layer 26, and a pixel electrode 20 disposed on the passivation layer 30 are disposed on the first substrate 24 in sequence. The second substrate 32 comprises a black matrix 36 disposed on a side of the second substrate 32 opposite to the first substrate 24.

In each pixel structure 10, the pixel electrode 20 disposed above the common electrode 22 constitute a storage capacitor. In addition, light-leakage regions are at two sides of the data line 12. Therefore, besides being a bottom electrode of the storage capacitor, the common electrode 22 together with the black matrix 36 disposed on the second substrate 32 and corresponding to the data line 12 also can shield the light-leakage regions. However, a coupling effect will be generated between the pixel electrode 20 and the data line 12. If the coupling effect between the pixel electrode 20 and the data line 12 is desired to be avoided, a distance there between should be increased. With the increase of the distance, the light-leakage regions at the two sides of the data line 12 will be broadened, so that the widths of the common electrode 22 and the black matrix 36 should be enlarged to shield the light-leakage regions. Hence, the aperture ratio will be reduced. In design, the black matrix 36 is disposed on the second substrate 32, and the misalignment between the first substrate 24 and the second substrate 32 should be considered, so that the width of the black matrix 36 also should be further broadened. Therefore, in the condition without affecting the aperture ratio, how to reduce the coupling effect between the pixel electrode and the data line is an extremely important goal.

SUMMARY OF THE INVENTION

It is therefore an objective of the claimed invention to provide a liquid crystal display device and a method of making the same with five PEPs so as to improve the coupling effect generated between the pixel electrode and the data line and to raise the aperture ratio of the liquid crystal display device.

According to the claimed invention, a liquid crystal display device is provided. The liquid crystal display device comprises a first substrate, a first conductive layer disposed on the first substrate, a gate insulating layer covering the first conductive layer, a second conductive layer disposed on the gate insulating layer, a passivation layer covering the second conductive layer, and a pixel electrode and a connecting line disposed on the passivation layer. The first conductive layer comprises a first sub-data line and a gate line, and the second conductive layer comprises a source electrode and a common electrode, wherein the common electrode is disposed corresponding to the first sub-data line.

According to the claimed invention, a liquid crystal display device is further provided. The liquid crystal display device comprises a first substrate, a first conductive layer disposed on the first substrate, a gate insulating layer covering the first conductive layer, a second conductive layer disposed on the gate insulating layer, a passivation layer covering the second conductive layer, and a third conductive layer disposed on the passivation layer. The first conductive layer comprises a first sub-data line and a gate line, and the second conductive layer comprises a source electrode, a drain electrode and a common electrode, wherein the common electrode covers the first sub-data line, and a width of the common electrode is substantially 0.8 to 3.5 times wider than a width of the first sub-data line. The third conductive layer comprises a pixel electrode and a connecting line, wherein the pixel electrode overlaps the common electrode. The connecting line is electrically connected to the first sub-data line, the second sub-data line and the source electrode, and the pixel electrode is connected to the drain electrode.

According to the claimed invention, a method of making a liquid crystal display device is provided. First, a first substrate is provided, and then a first photolithographic and etching process is performed to form a first sub-data line, a second sub-data line, and a gate line on the first substrate. Next, a gate insulating layer is formed and covers the first substrate. Next, a second photolithographic and etching process is performed to form a semiconductor layer on the gate insulating layer. Next, a third photolithographic and etching process is performed to form a source electrode, a drain electrode, and a common electrode on the gate insulating layer. Next, a passivation layer is formed and covers the first substrate, and then, a fourth photolithographic and etching process is performed to form a first through hole and a second through hole in the passivation layer. Finally, a fifth photolithographic and etching process is performed to form a pixel electrode and a connecting line on the passivation layer.

The present invention utilizes the data lines disposed in the first conductive layer, and also enlarges the distance between the data line and the pixel electrode. Furthermore, the common electrode is disposed in the second conductive layer to be the shield, so that the coupling effect between the pixel electrode and the data line can be reduced. Because the coupling effect is reduced, the distance between the pixel electrodes can be reduced, so that the aperture ratio of the LCD device is increased. In addition, the present invention only utilizes five PEPs to make the LCD device while reducing the coupling effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14 is a schematic diagram illustrating a cross-section of the pixel structure along line EE' of FIG. 12.

DETAILED DESCRIPTION

Figure 1:
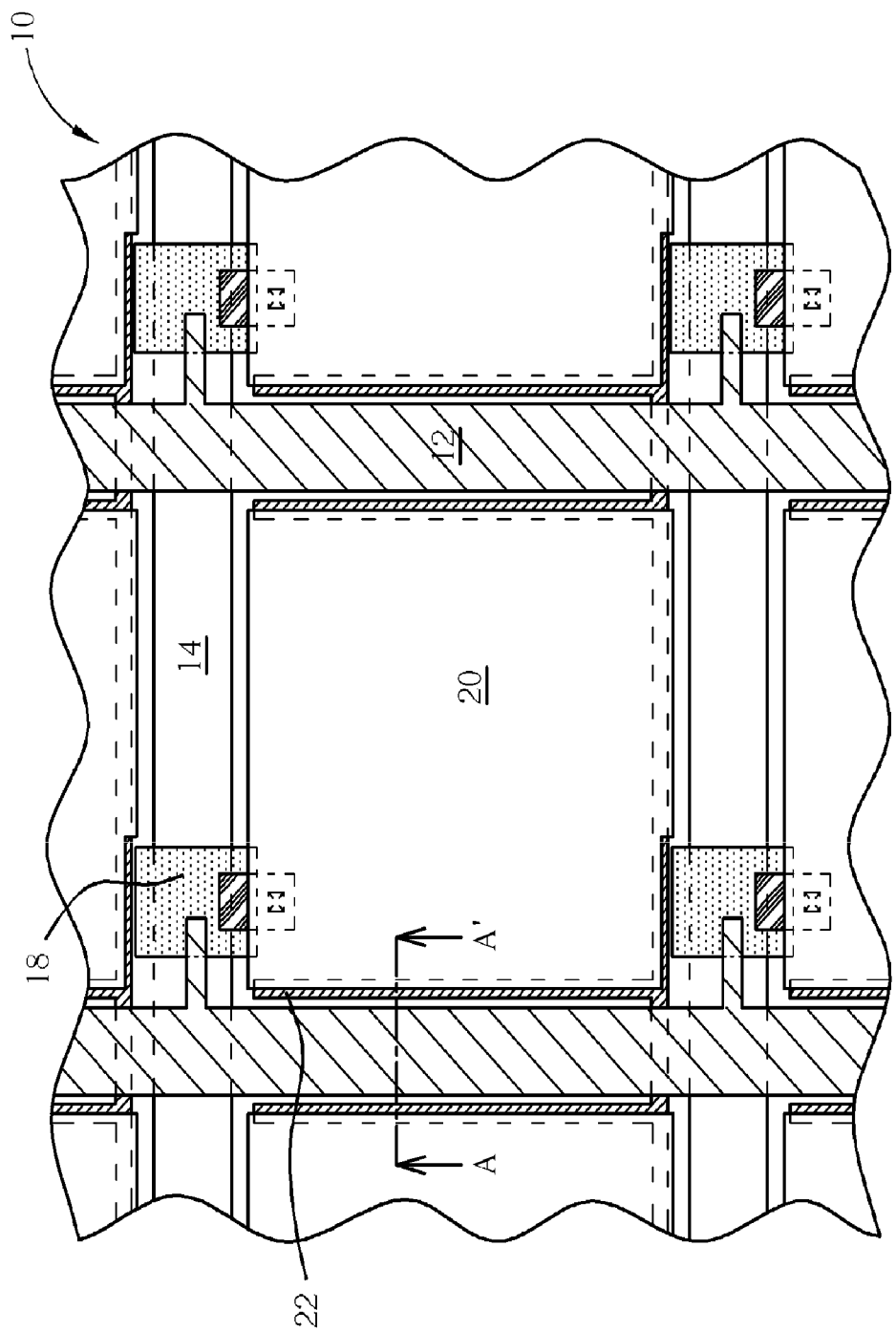
FIG. 1 is a schematic diagram illustrating a top view of a pixel structure of an LCD according to a prior art.
Figure 2:
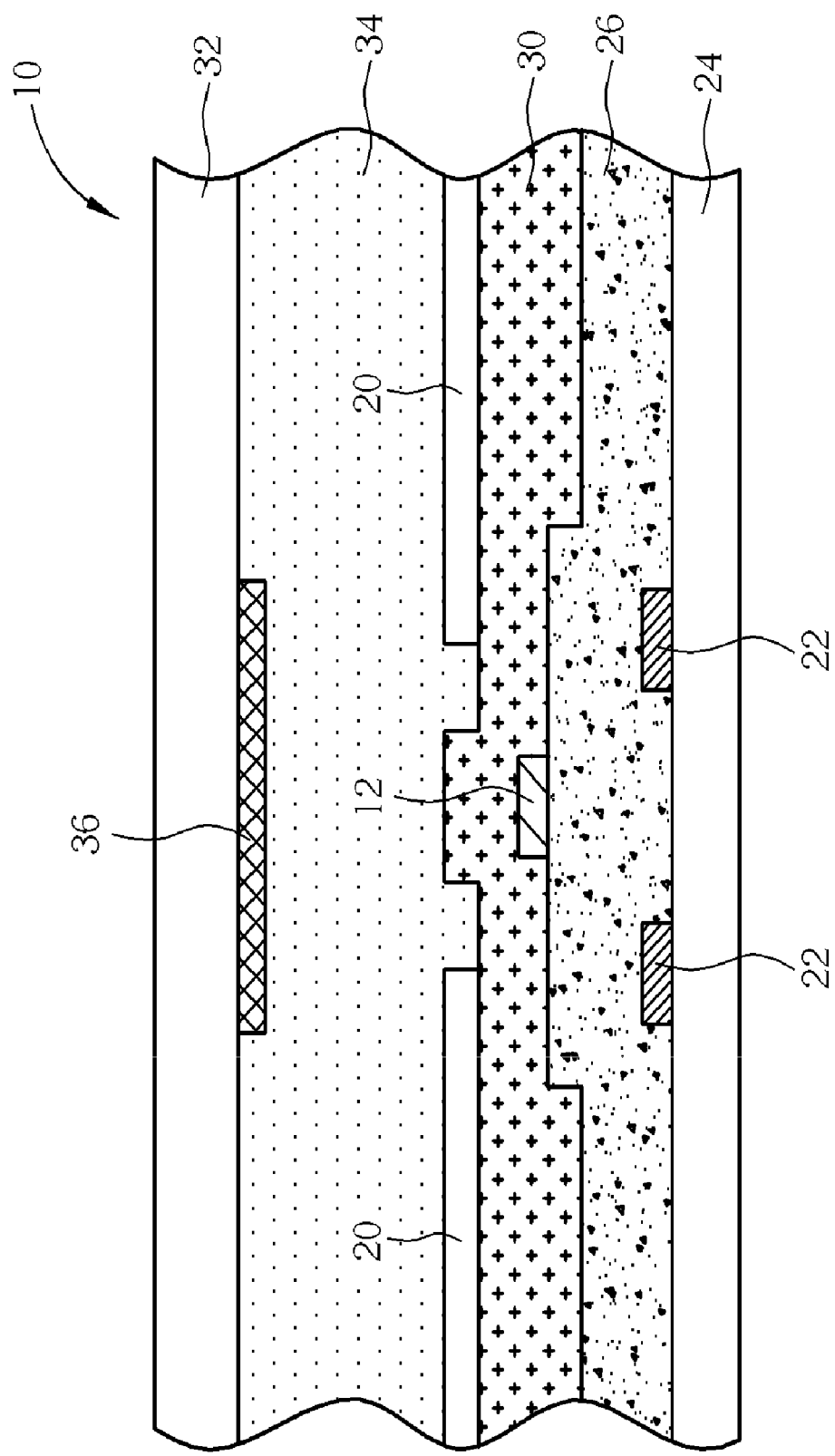
FIG. 2 is a schematic diagram illustrating a cross-section of the LCD along line AA' of FIG. 1.
Figure 3:
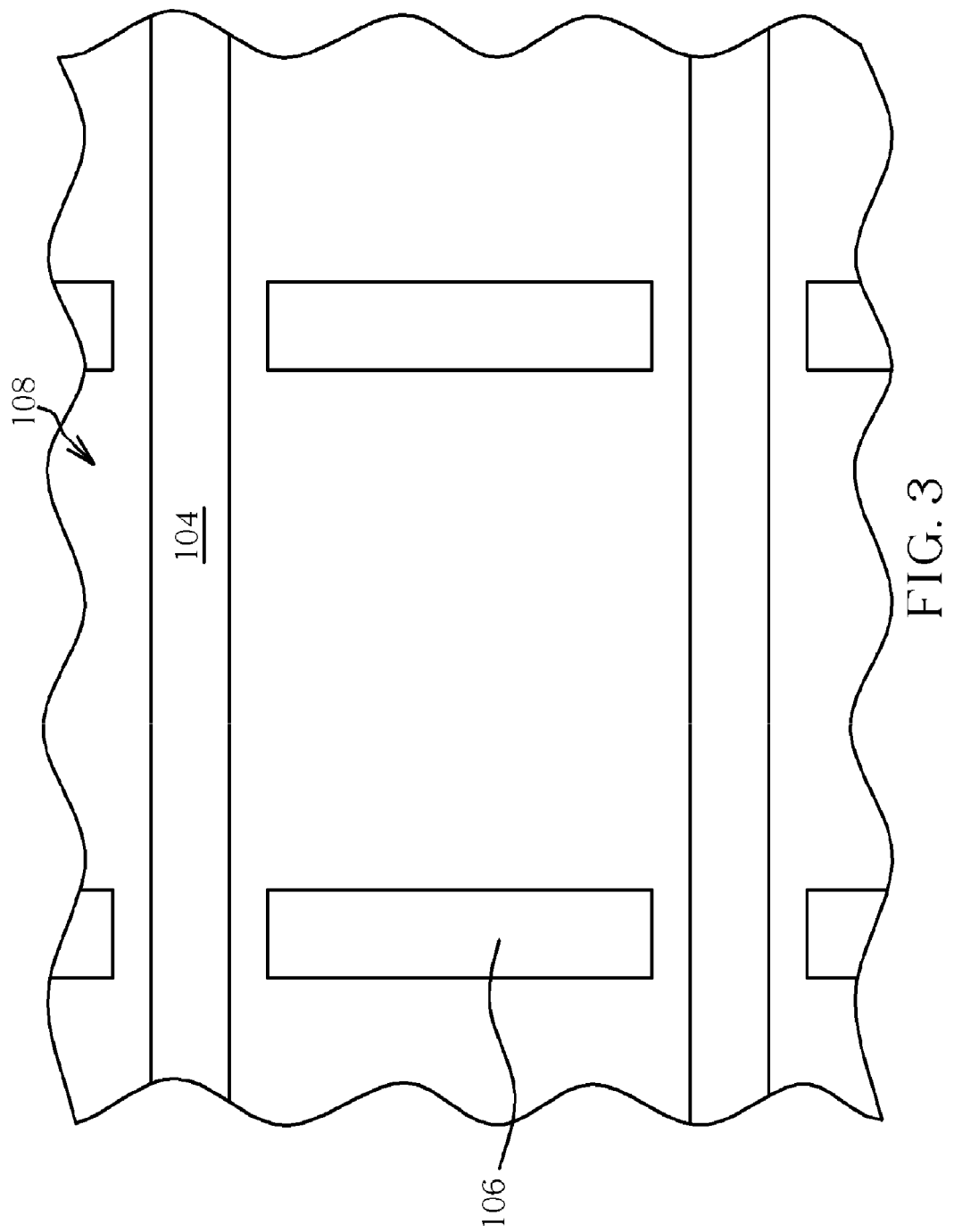
FIG. 3 through FIG. 7 are schematic diagrams illustrating a method of making a pixel structure of an LCD device according to a first embodiment of the present invention.
Figure 4:
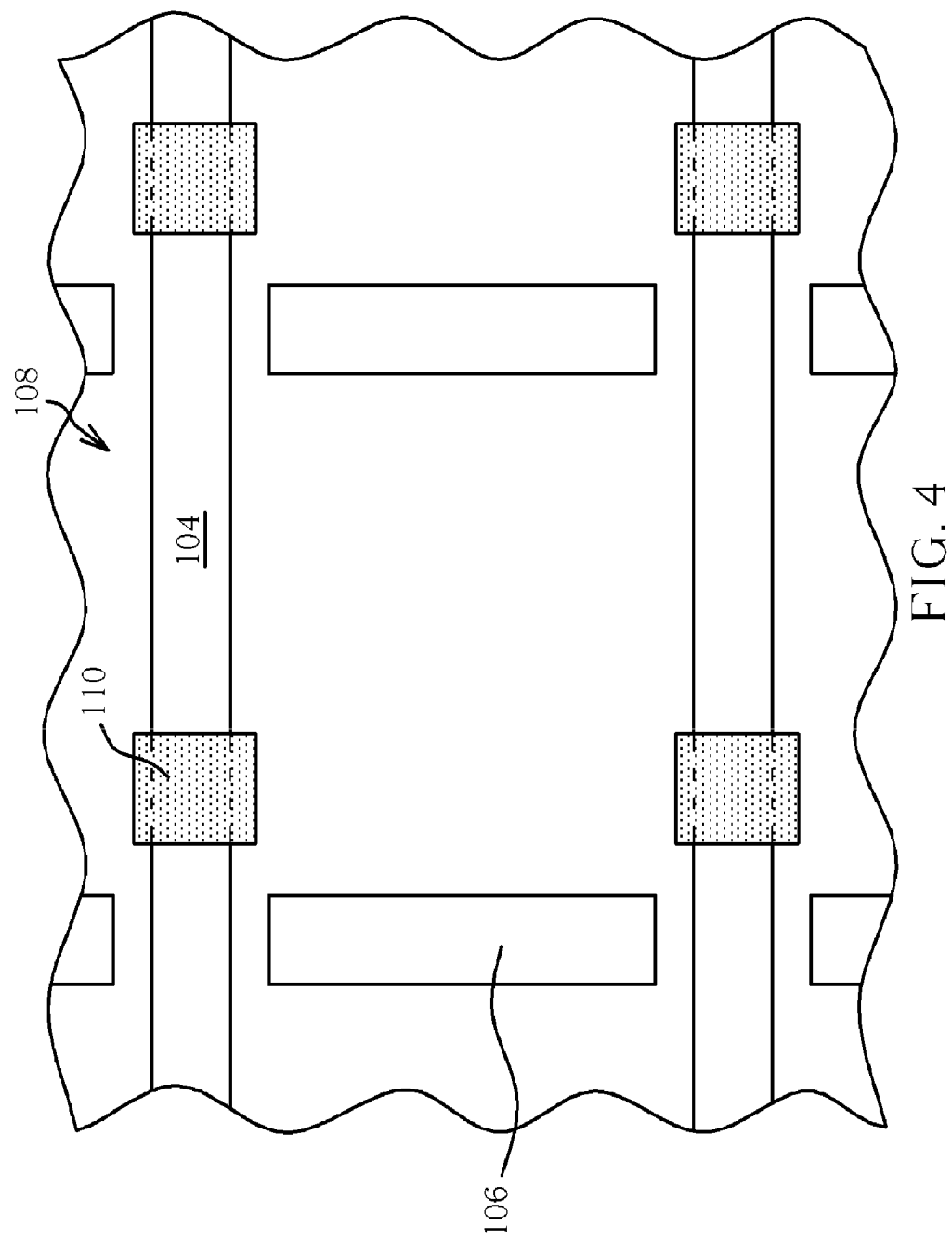
Figure 5:
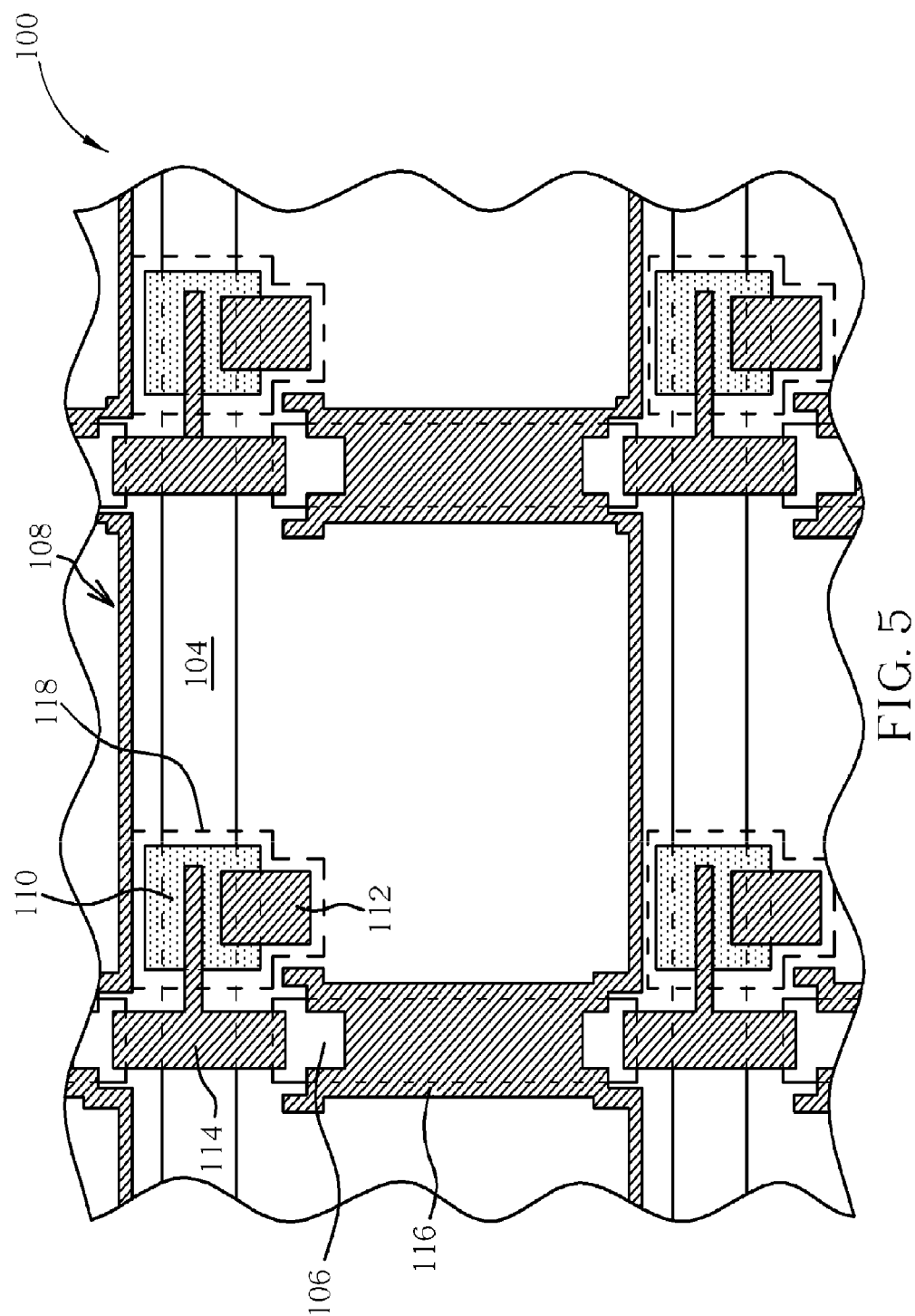
Figure 6:
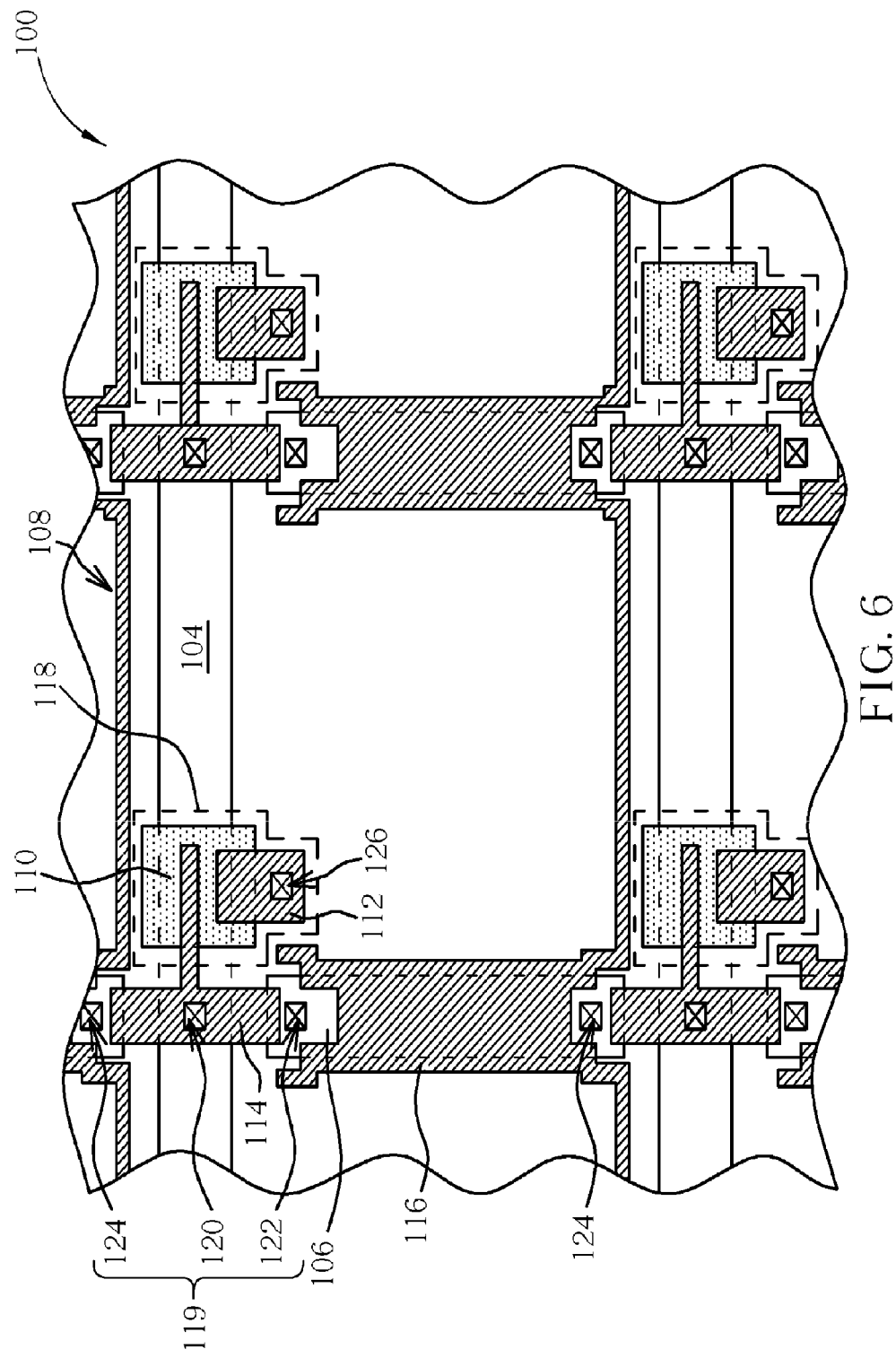
Figure 7:
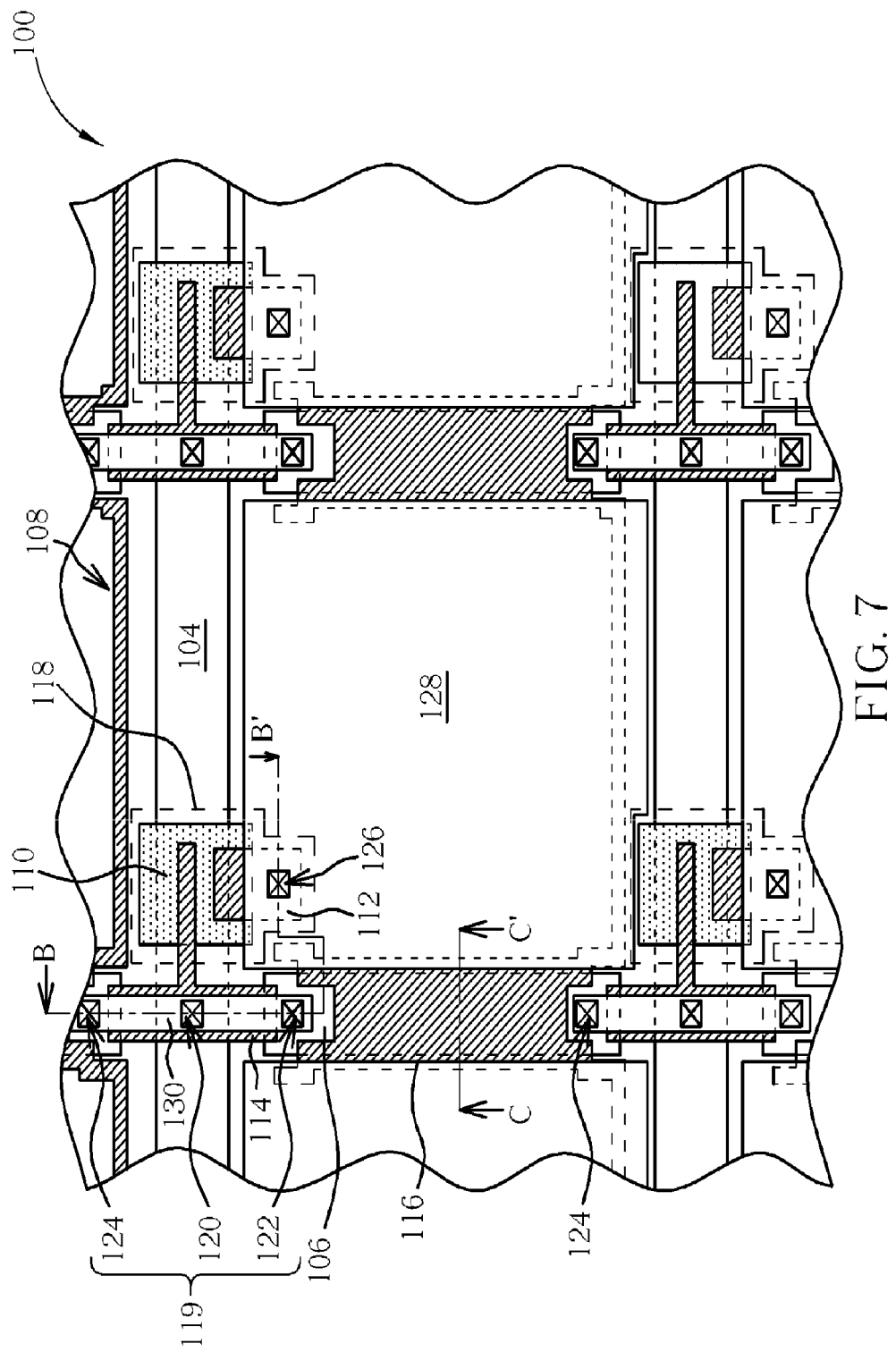

Referring to FIG. 3 through FIG. 7, FIG. 3 through FIG. 7 are schematic diagrams illustrating a method of making a pixel structure of an LCD device according to a first embodiment of the present invention. First, as shown in FIG. 3, a first substrate (not shown in FIG. 3 through FIG. 7) is provided, and then, a first photolithographic and etching process (PEP) is performed to pattern a first conductive layer on the first substrate, wherein the patterned first conductive layer comprises a plurality of gate lines 104 and sub-data lines 106, and two parallel gate lines 104 and two adjacent sub-data lines 106 disposed between the gate lines 104 define a pixel region 108. Thereafter, a gate insulating layer (not shown in FIG. 3 through FIG. 7) is formed and covers the patterned first conductive layer and the first substrate. Next, as shown in FIG. 4, a second PEP is performed to pattern a semiconductor layer 110 on the gate insulating layer, wherein the semiconductor layer 110 comprises an amorphous silicon layer and a doped amorphous silicon layer (not shown in figure), such as a N-type doped amorphous silicon layer. The amorphous silicon layer and the doped amorphous silicon layer are respectively disposed on the gate insulating layer in sequence. Next, as shown in FIG. 5, a third PEP is performed to pattern a second conductive layer on the gate insulating layer and the semiconductor layer 110, wherein the patterned second conductive layer disposed in each pixel region 108 comprises a drain electrode 112, a source electrode 114 and a common electrode 116. In each pixel region 108, the drain electrode 112, the source electrode 114, the semiconductor layer 110 and the gate line 104 overlapping the semiconductor layer 110 constitute a thin film transistor (TFT) 118, and the common electrode 116 overlaps the sub-data lines 106. Then, a passivation layer (not shown in FIG. 5 through FIG. 7) is formed and covers the patterned second conductive layer and the gate insulating layer. Next, as shown in FIG. 6, a fourth PEP is performed to form a first through hole 119 and a second through hole 126 on the passivation layer in each pixel region 108, wherein the first through hole 119 comprises a first sub-through hole 120, a second sub-through hole 122 and a third sub-through hole 124. The first sub-through hole 120 is disposed corresponding to the source electrode 114, and the second sub-through hole 122 and the third sub-through hole 124 are respectively disposed on two sub-data lines 106 corresponding to two sides of the gate line 104 and not overlapping the source electrode 114 and the common electrode 116. In addition, the second through hole 126 is disposed corresponding to the drain electrode 112. Finally, as shown in FIG. 7, a fifth PEP is performed to pattern a pixel electrode 128 and a connecting line 130 on the passivation layer in each pixel structure 100. The pixel electrode 128 extends through the second through hole 126 to electrically connect the drain electrode 112. The connecting line 130 electrically connect two adjacent sub-data lines 106 and the source electrode 114 through the first sub-through hole 120, the second sub-through hole 122 and the third sub-through hole 124. Therefore, the pixel structure 100 of the embodiment is completed. The pixel electrode 128 and the connecting line 130 are electrically insulated from each other and composed of a same transparent conductive material, such as indium-tin oxide (ITO), indium-zinc oxide (IZO), aluminum-zinc oxide (AZO), and the present invention is not limited to this. It should be noted that the pixel structure 100 of the embodiment totally only requires five PEPs to complete.

Figure 8:
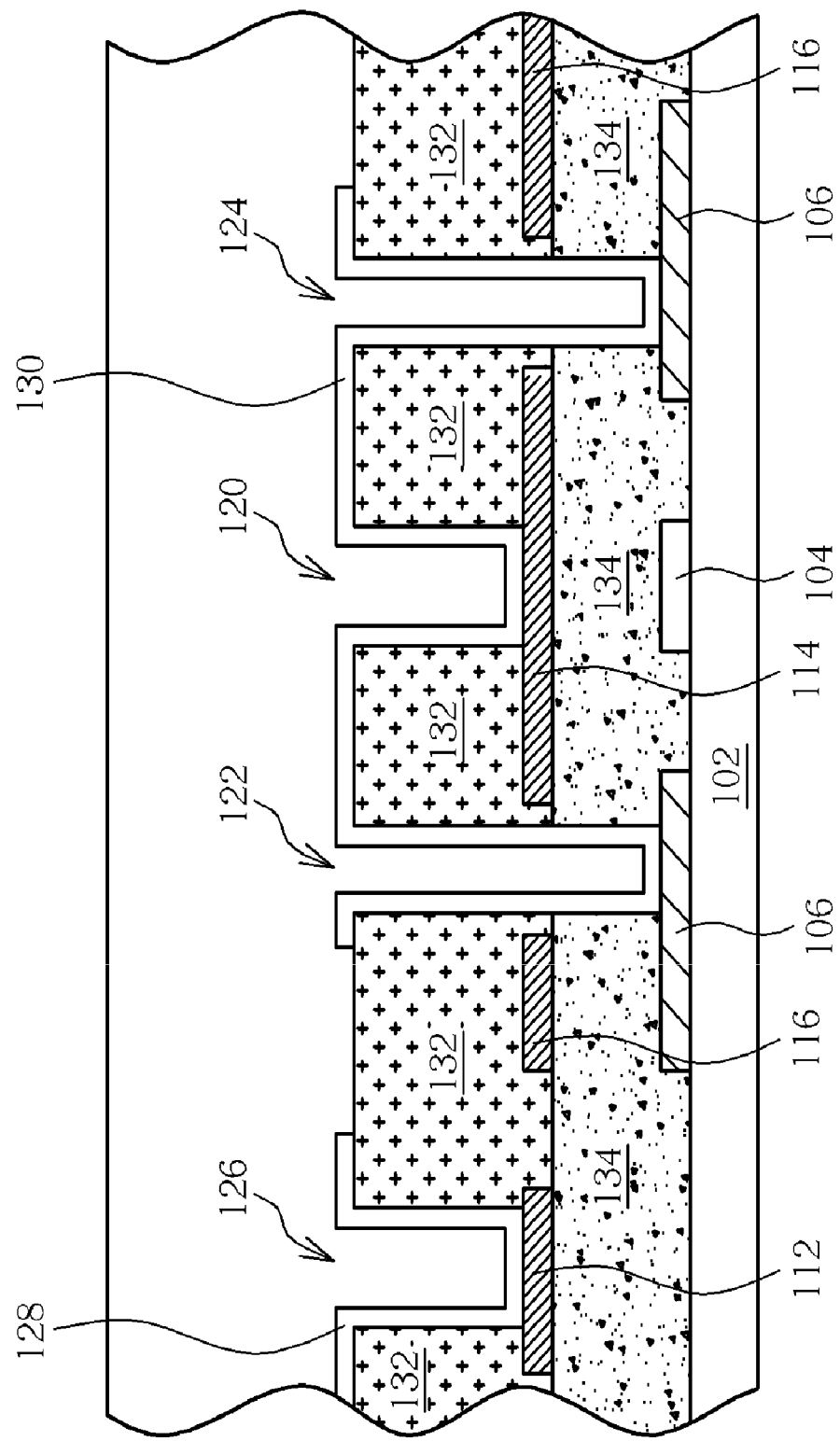
FIG. 8 is a schematic diagram illustrating a cross-section of the pixel structure along line BB' of FIG. 7.

In addition, the pixel structure 100 of the embodiment is described below in detail. Referring to FIG. 8, FIG. 8 is a schematic diagram illustrating a cross-section of the pixel structure along line BB' of FIG. 7. As shown in FIG. 8, in each pixel region, the second through hole 126 is etched by the etching process to pass through the passivation layer 132 and stop on the drain electrode 112 so as to expose the drain electrode 112. Therefore, the pixel electrode 128 patterned in the next PEP can be electrically connected to the drain electrode 112. In addition, in the first through hole 119, the first sub-through hole 120 is etched to pass through the passivation layer 132 and stop on the source electrode 114 by the etching process so as to expose the source electrode 114. The second sub-through hole 122 and the third sub-through hole 124 in the adjacent pixel regions are etched to pass through the passivation layer 132 and the gate insulating layer 134 and stop on the sub-data line 106 by the etching process, so that two adjacent sub-data lines 106 at two sides of the same gate line 104 are respectively exposed. The connecting line 130 extends through the first sub-through hole 120, the second sub-through hole 122 and the third sub-through hole 124 to electrically connect the source electrode 114 with the two adjacent sub-data lines 106 at two sides of the same gate line 104. The two adjacent sub-data lines 106 at two sides of the same gate line 104 can be electrically connected to each other and electrically connected to the source electrode 114 via the connecting line 130. Therefore, the sub-data lines 106, which originally are not electrically connected to each other, in a line, can be electrically connected to each other so as to form a completed data line. In this embodiment, the source electrode 114 along the line BB' partially overlaps the two adjacent sub-data lines 106, and the length of the source electrode 114 along the line BB' is larger than the width of the gate line 104. It should be noted that the data line of this embodiment could be disposed in the first conductive layer according to the above-mentioned structure. Therefore, the distance between the data line and the pixel electrode 128 can be enlarged so as to reduce the coupling effect between the data line and the pixel electrode 128.

Figure 9:
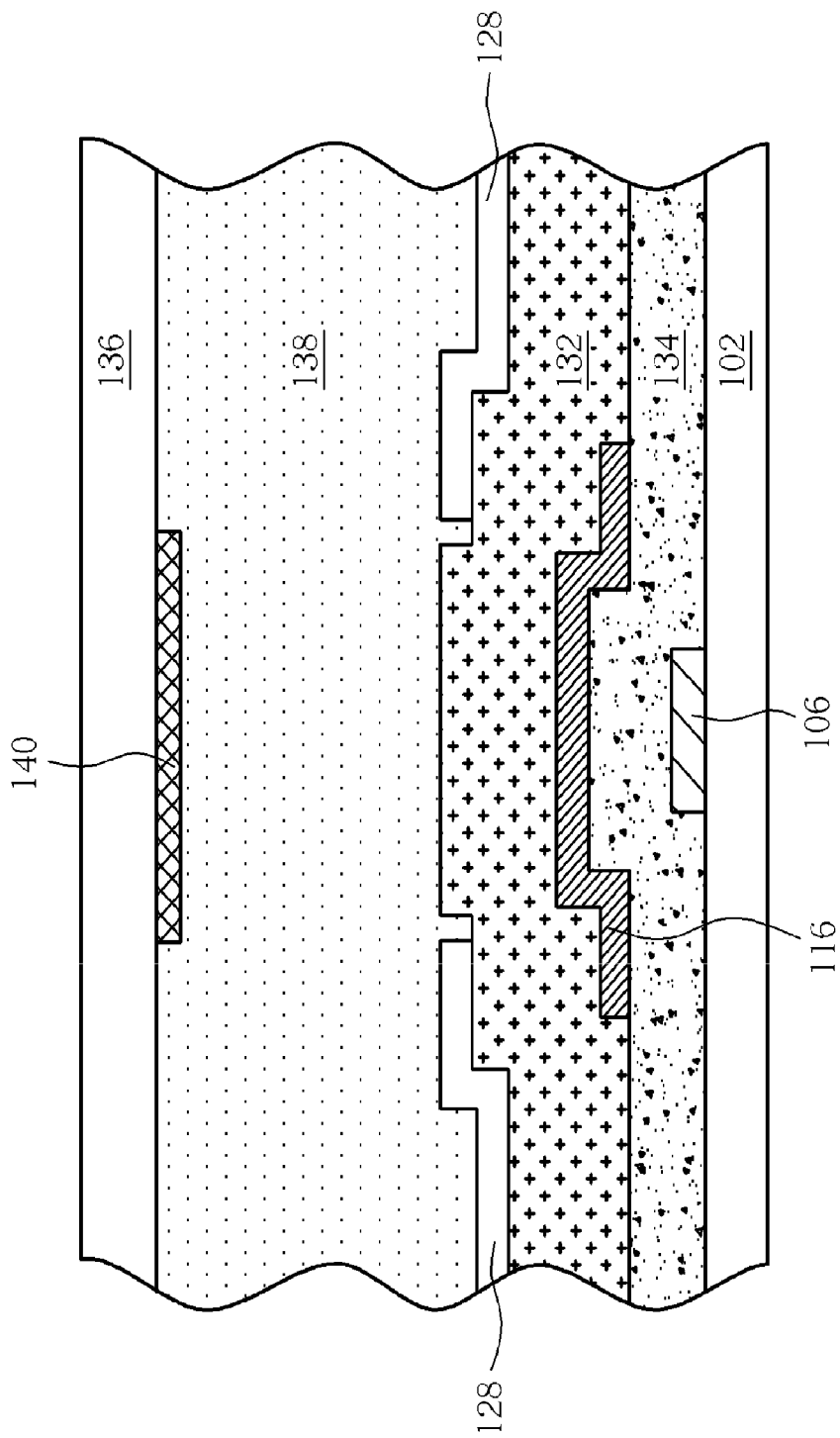
FIG. 9 is a schematic diagram illustrating a cross-section of the pixel structure along line CC' of FIG. 7.

The improvement of this embodiment for the aperture ratio and the coupling effect is described below. Referring to FIG. 9, FIG. 9 is a schematic diagram illustrating a cross-section of the pixel structure along line CC' of FIG. 7. As shown in FIG. 9, the pixel structure 100 of the LCD device further comprises a second substrate 136 and a liquid crystal layer 138. The second substrate 136 is disposed on a side of the first substrate 102 having the pixel structure 100. The liquid crystal layer 138 is disposed between the first substrate 102 and the second substrate 136. A side of the second substrate 136 facing the first substrate 102 has a light-shielding layer 140 between two adjacent pixel regions 108. The light-shielding layer 140 is disposed corresponding to the sub-data line 106, and the light-shielding layer 140 overlaps edges of the pixel electrodes 128 in the two adjacent pixel regions 108 so as to shield the light emitted from the light-leakage region at the edge of the pixel electrode 128. In this embodiment, the pixel electrode 128 overlaps the common electrode 116, and the width of the common electrode 116 is larger than the width of the sub-data line 106 so that the common electrode 116 has a function of shielding the coupling effect between the pixel electrode 128 and the sub-data line 106. The preferred aperture ratio can be obtained when the width of the common electrode 116 is substantially 0.8 to 3.5 times wider than the width of the sub-data line 106. Depending on the shield of the common electrode 116, the edges of the pixel electrode 128 can be adjacent to the sub-data line 106, and even overlapping the sub-data line 106. Therefore, the distance between the pixel electrodes 128 in the two adjacent pixel regions can be reduced to be smaller than the distance in the prior art. The distance between the light-leakage regions also can be reduced, so that the width of the light-shielding layer 140 used for shielding the light-leakage region can also be reduced, such as reduced to 6 um. In addition, reducing the area of the light-shielding layer 140 can increase the quantity of the light of the backlight passing through the pixel structure 100. This means that the aperture ratio of the pixel structure 100 of the LCD device according to this embodiment also be increased.

Furthermore, in this embodiment, the pixel electrode 128 overlapping the common electrode 116 and the passivation layer 132 there between constitute a storage capacitor. The storage capacitance of the storage capacitor in a unit area can also be raised. The area of the common electrode can be reduced. Therefore, the coupling effect can be reduced, and the aperture ratio can also be raised. Therefore, the display quality of the LCD is raised.

Figure 10:
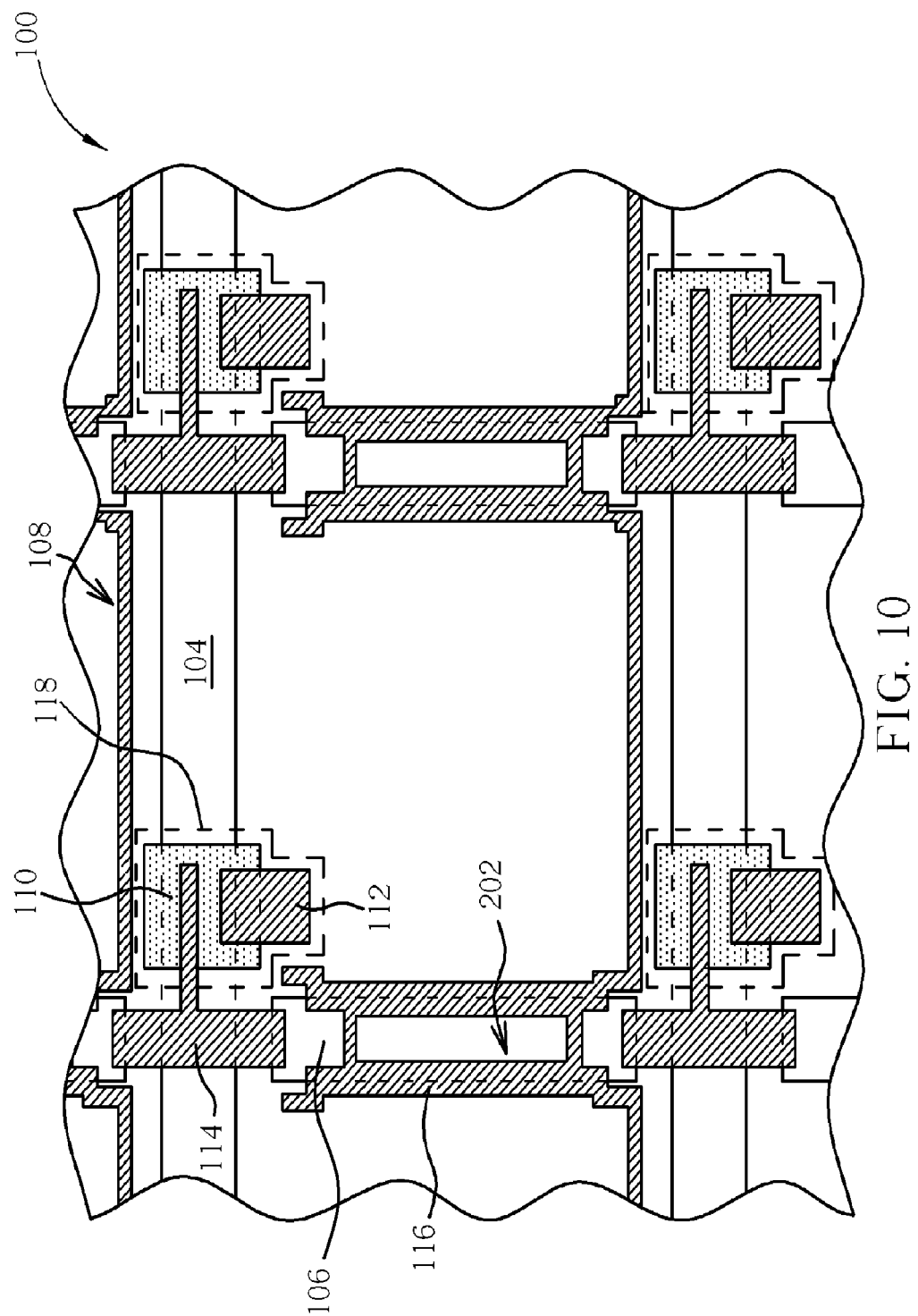
FIG. 10 through FIG. 12 are schematic diagrams illustrating a method of making the pixel structure of the LCD according to a second embodiment of the present invention.
Figure 11:
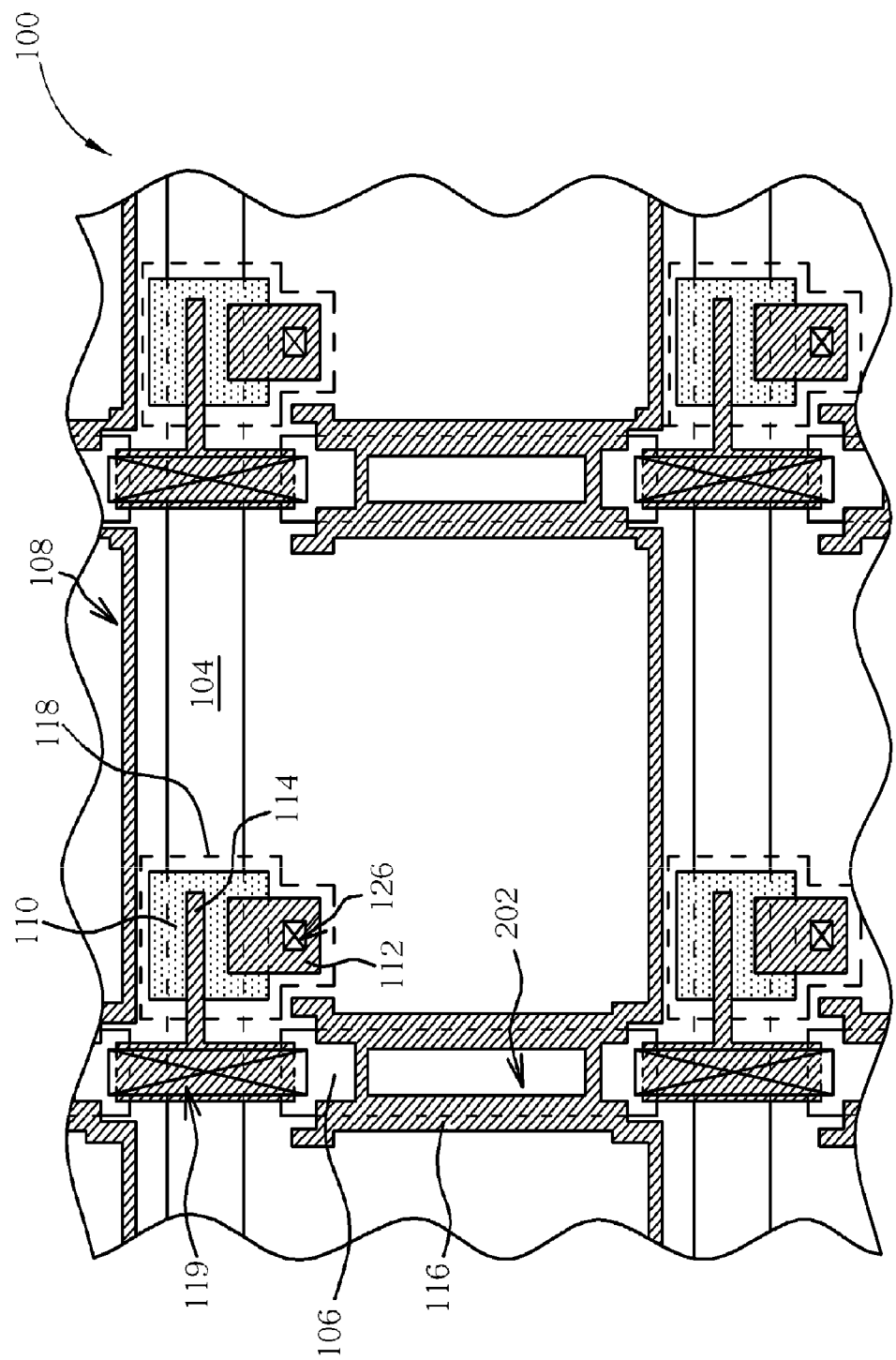
Figure 12:
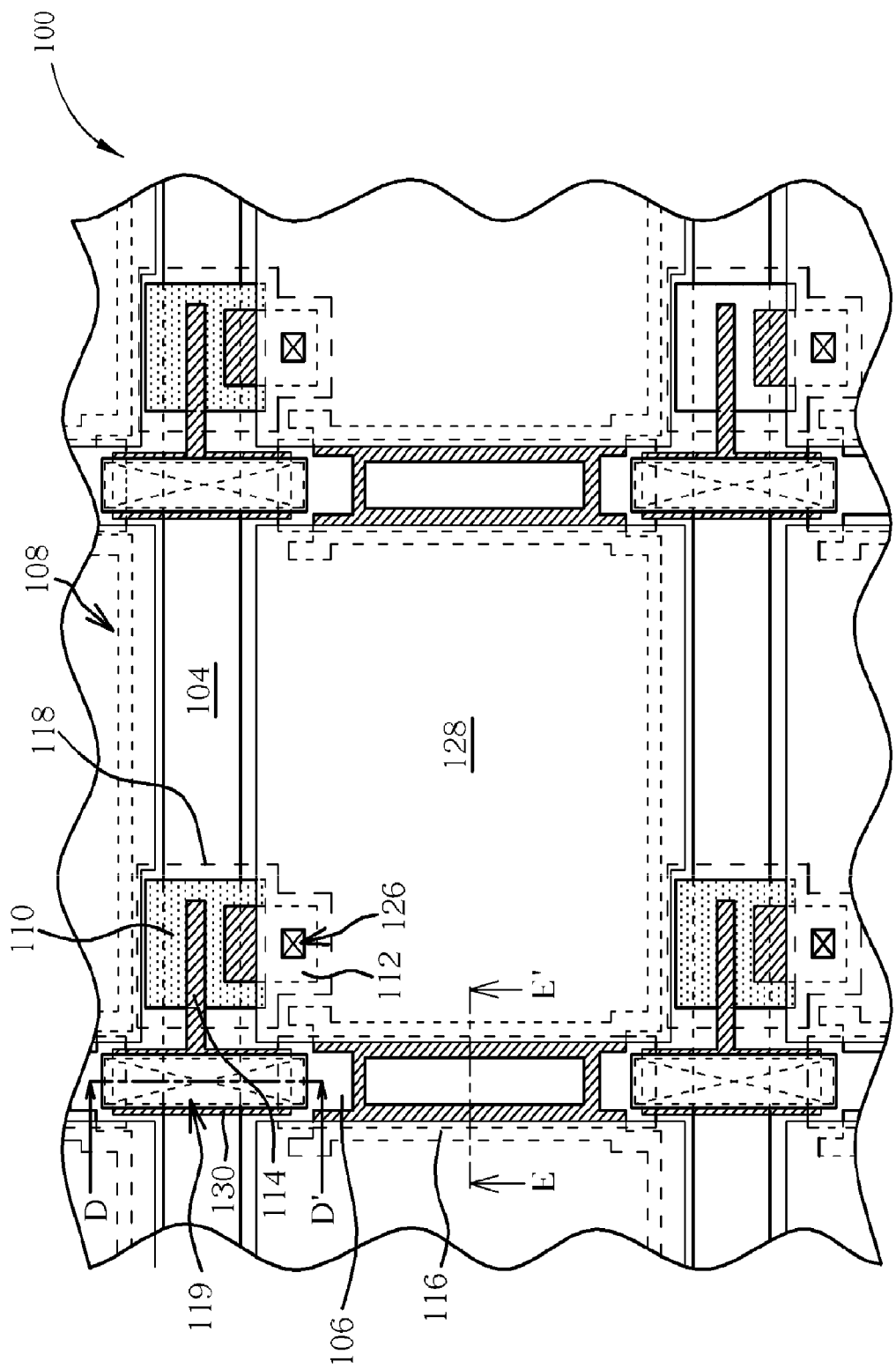

However, the present invention is not limited to the above-mentioned embodiment. Like elements are denoted by like numerals, and are not detailed redundantly. Referring to FIG. 10 through FIG. 12, FIG. 10 through FIG. 12 are schematic diagram illustrating a method of making the pixel structure of the LCD according to a second embodiment of the present invention. Before performing the second PEP, the method of this embodiment is the same as the method of the first embodiment, so that the method before performing the second PEP will not be described redundantly. The method of making the pixel structure 100 of the LCD device according to this embodiment will be described from a step after performing the second PEP. Next, as shown in FIG. 10, a third PEP is performed to pattern a second conductive layer on the gate insulating layer (not shown in FIG. 10 through FIG. 12) and the patterned semiconductor layer 110 in each pixel region 108. The second conductive layer comprises a drain electrode 112, a source electrode 114 and a common electrode 116, and the common electrode 116 has an opening 202 exposing a part of the sub-data line 106. Then, a passivation layer (not shown in FIG. 10 through FIG. 12) is formed and covers the patterned second conductive layer and the gate insulating layer. Next, as shown in FIG. 11, a fourth PEP is performed to form a first through hole 119 and a second through hole 126. The first through hole 119 is disposed corresponding to the source electrode 114, and the first through hole 119 overlaps two sub-data lines 106 at two sides of the gate line 104. The second through hole 126 is disposed corresponding to the drain electrode 112. Finally, as shown in FIG. 12, a fifth PEP is performed to form a pixel electrode 128 and a connecting line 130 on the passivation layer. The connecting line 130 extends through the first through hole 119 to electrically connect the two adjacent sub-data lines 106 with the source electrode 114. The pixel electrode 128 extends through the second through hole 126 to electrically connect the drain electrode 112. The pixel structure 100 of this embodiment is completed.

Figure 13:
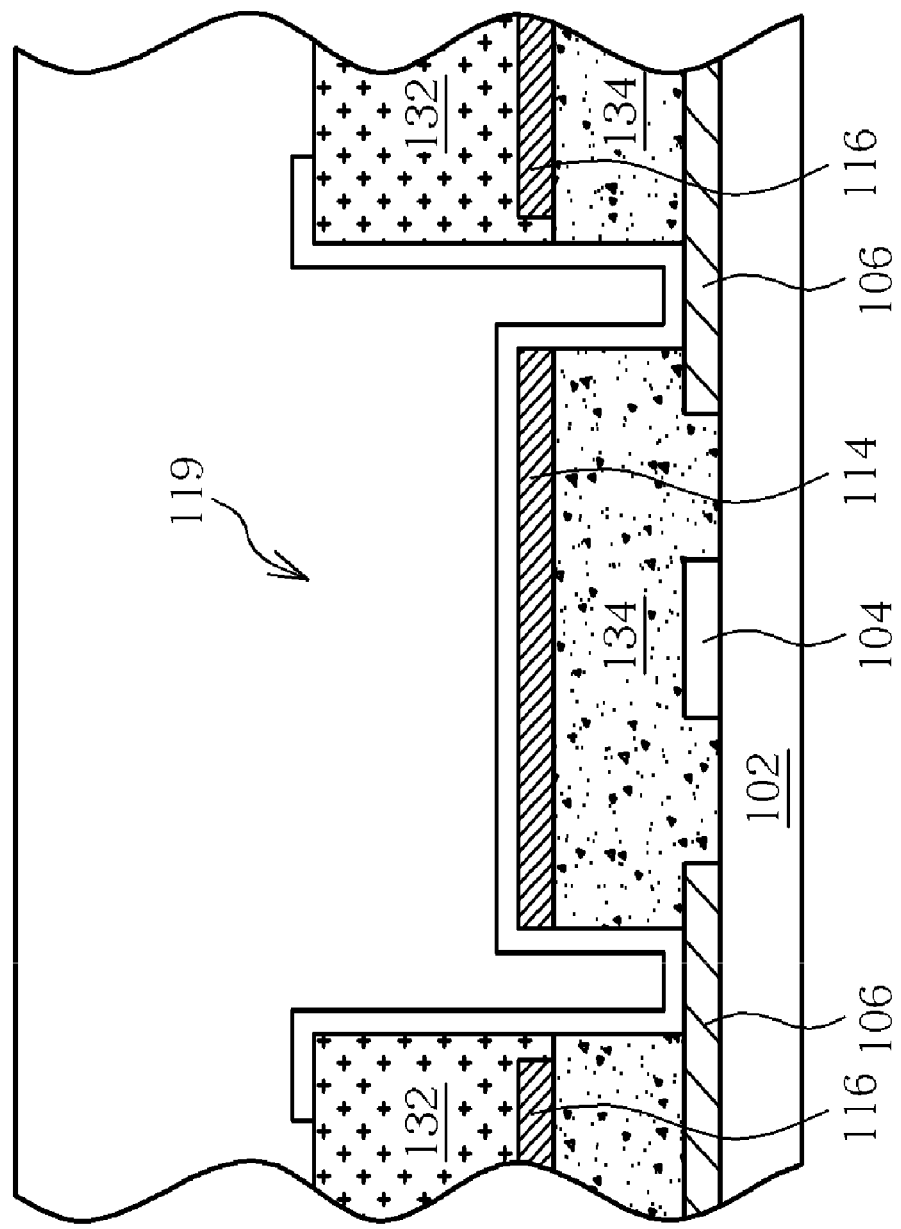
FIG. 13 is a schematic diagram illustrating a cross-section of the pixel structure along line DD' of FIG. 12.

Referring to FIG. 13, FIG. 13 is a schematic diagram illustrating a cross-section of the pixel structure along line DD' of FIG. 12. As shown in FIG. 13, compared with the first embodiment, the first through hole 119 of this embodiment is different from the first through hole 119 of the first embodiment. In fourth PEP, the etching material etches through the passivation layer 132, which is above the source electrode 114 and overlaps a part of the source electrode 114, and the source electrode 114 will not be etched. The source electrode 114 is therefore exposed. In a part of the two adjacent sub-data lines 106, the etching material will etch through the gate insulating layer 134 and the passivation layer 132 above the sub-data lines 106 so as to expose the sub-data lines 106. For this reason, the connecting line 130 patterned in the fifth PEP can extends through the first through hole 119 to electrically connect the source electrode 114 with the two adjacent sub-data lines 106, and the adjacent sub-data lines 106 can be electrically connected to each other via the connecting line 130 so as to form a data line. In this embodiment, in order to expose a part of the sub-data lines 106 via the first through hole 119, the source electrode 114 along the line DD' overlaps the two adjacent sub-data lines 106, and the length of the source electrode 114 along the line DD' is larger than the width of the gate line 104.

In addition, referring to FIG. 14, FIG. 14 is a schematic diagram illustrating a cross-section of the pixel structure along line EE' of FIG. 12. As shown in FIG. 14, compared with the first embodiment, the common electrode 116 of this embodiment has an opening 202, and the pixel electrode 128 of this embodiment overlaps the sub-data lines 106. For preventing the overlapping area between the sub-data line 106 and the common electrode 116 from being overly large to have an overly large coupling capacitance, this embodiment provides an opening 202, which is formed by etching a part of the common electrode 116 overlapping the sub-data line 106 to reduce the coupling effect between the sub-data line 106 and the common electrode 116. Furthermore, due to the shield of the common electrode 116, the edges of the pixel electrode 128 can overlap the sub-data lines 106. This means that the distance between the pixel electrodes 128 in the adjacent pixel regions is reduced. Therefore, the width of the light-shielding layer can also be reduced, so that the aperture ratio can be raised.

In summary, the LCD device of the present invention utilizes the data lines to be separated into segments and disposed in the first conductive layer, and also utilizes the connecting line to connect the separated data lines. Also, the distance between the data line and the pixel electrode is enlarged, and the common electrode is disposed in the second conductive layer to be the shield, so that the coupling effect between the pixel electrode and the data line in the prior art can be reduced. Because the coupling effect is reduced, the distance between the pixel electrodes can be reduced, so that the aperture ratio of the LCD device is increased. In addition, the present invention only utilizes five PEPs to make the LCD device with reducing the coupling effect.

Those skilled in the art will readily observe that numerous modifications and alterations of the device and method may be made while retaining the teachings of the invention.

What is claimed is:

1. A liquid crystal display device, comprising:
   a first substrate;
   a first conductive layer disposed on the first substrate, and the first conductive layer comprising a first sub-data line and a gate line;
   a gate insulating layer covering the first conductive layer;
   a second conductive layer disposed on the gate insulating layer, and the second conductive layer comprising a source electrode and a common electrode, wherein the common electrode is disposed corresponding to the first sub-data line;
   a passivation layer covering the second conductive layer; and
   a pixel electrode and a connecting line disposed on the passivation layer, and the common electrode, the passivation layer and the pixel electrode constituting a storage capacitor, wherein the common electrode has a part disposed between the pixel electrode and the first sub-data line, the part has a width along the gate line and a length along the first sub-data line, and the length is larger than the width.

2. The liquid crystal display device of claim 1, wherein the pixel electrode overlaps the common electrode.

3. The liquid crystal display device of claim 1, wherein the pixel electrode overlaps the first sub-data line.

4. The liquid crystal display device of claim 1, wherein the width of the part of the common electrode is larger than a width of the first sub-data line.

5. The liquid crystal display device of claim 4, wherein the part of the common electrode has an opening exposing a part of the first sub-data line.

6. The liquid crystal display device of claim 1, further comprising a second substrate disposed corresponding to the first substrate.

7. The liquid crystal display device of claim 6, further comprising a light-shielding layer disposed on a side of second substrate corresponding to the first substrate.

8. The liquid crystal display device of claim 7, wherein the light-shielding layer is disposed corresponding to the first sub-data line.

9. The liquid crystal display device of claim 7, wherein the light-shielding layer is disposed corresponding to an edge of the pixel electrode.

10. The liquid crystal display device of claim 9, wherein the edge of the pixel electrode is adjacent to the first sub-data line.

11. The liquid crystal display device of claim 6, further comprising a liquid crystal layer disposed between the first substrate and the second substrate.

12. The liquid crystal display device of claim 1, wherein the first conductive layer further comprises a second sub-data line.

13. The liquid crystal display device of claim 12, wherein the first sub-data line is electrically connected to the second sub-data line via the connecting line.

14. The liquid crystal display device of claim 1, wherein the first sub-data line is electrically connected to the source electrode via the connecting line.

15. The liquid crystal display device of claim 1, wherein a length of the source electrode is larger than a width of the gate line.

16. The liquid crystal display device of claim 1, wherein the source electrode overlaps the first sub-data line and the gate line.

17. The liquid crystal display device of claim 1, wherein the common electrode is electrically insulated from the connecting line.

18. The liquid crystal display device of claim 1, wherein the second conductive layer further comprising a drain electrode electrically connected to the pixel electrode.

19. A liquid crystal display device, comprising:
   a first substrate;
   a first conductive layer disposed on the first substrate, and the first conductive layer comprising a first sub-data line and a gate line;
   a gate insulating layer covering the first conductive layer;
   a second conductive layer disposed on the gate insulating layer, and the second conductive layer comprising a source electrode, a drain electrode and a common electrode, wherein the common electrode covers the first sub-data line, and a width of the common electrode is substantially 0.8 to 3.5 times wider than a width of the first sub-data line;
   a passivation layer covering the second conductive layer; and
   a third conductive layer disposed on the passivation layer, and the third conductive layer comprising a pixel electrode and a connecting line, wherein the pixel electrode overlaps the common electrode, the common electrode has a part disposed between the pixel electrode and the first sub-data line, the part has a width along the gate line and a length along the first sub-data line, and the length is larger than the width;
   wherein the connecting line is electrically connected to the first sub-data line and the source electrode, and the pixel electrode is connected to the drain electrode.

20. A method of making a liquid crystal display device, comprising:
   providing a first substrate;
   forming a first sub-data line, a second sub-data line, and a gate line on the first substrate;
   forming a gate insulating layer covering the first substrate;
   forming a semiconductor layer on the gate insulating layer;
   forming a source electrode, a drain electrode, and a common electrode on the gate insulating layer;
   forming a passivation layer covering the first substrate;
   etching the passivation layer and the gate insulating layer to form a first through hole and a second through hole exposing the first sub-data line, the source electrode and the drain electrode; and
   forming a pixel electrode and a connecting line on the passivation layer; and the common electrode, the passivation layer and the pixel electrode constituting a storage capacitor, wherein the connecting line extends through the first through hole to electrically connect the first sub-data line with the source electrode, the pixel electrode extends through the second through hole to electrically connect the drain electrode, the common electrode has a part disposed between the pixel electrode and the first sub-data line, the part has a width along the gate line and a length along the first sub-data line, and the length is larger than the width.

* * * * *